(12) United States Patent
Wuister et al.

(10) Patent No.: US 9,250,528 B2
(45) Date of Patent: Feb. 2, 2016

(54) METHODS AND COMPOSITIONS FOR PROVIDING SPACED LITHOGRAPHY FEATURES ON A SUBSTRATE BY SELF-ASSEMBLY OF BLOCK COPOLYMERS

(71) Applicant: ASML Netherlands B.V., Veldhoven (NL)

(72) Inventors: Sander Frederik Wuister, Eindhoven (NL); Emiel Peeters, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/391,156

(22) PCT Filed: Mar. 19, 2013

(86) PCT No.: PCT/EP2013/055689
§ 371 (c)(1),
(2) Date: Oct. 7, 2014

(87) PCT Pub. No.: WO2013/160027
PCT Pub. Date: Oct. 31, 2013

(65) Prior Publication Data
US 2015/0064630 A1    Mar. 5, 2015

Related U.S. Application Data

(60) Provisional application No. 61/639,586, filed on Apr. 27, 2012.

(51) Int. Cl.
*G03F 7/20*    (2006.01)
*C08L 53/00*   (2006.01)
(Continued)

(52) U.S. Cl.
CPC . *G03F 7/20* (2013.01); *B82Y 10/00* (2013.01); *B82Y 40/00* (2013.01); *C08L 53/00* (2013.01); *G03F 7/0002* (2013.01)

(58) Field of Classification Search
CPC ............. H01L 2924/15165; H01L 31/0512; H01L 21/0337; H01L 21/31144; H01L 21/0274; H01L 21/32139; G03F 7/0002; G03F 7/038; G03F 7/0035; G03F 7/004; G03F 7/2002; G03F 7/20; C08L 53/00; B82Y 40/00; B82Y 10/00
USPC .................................................. 430/322, 296
See application file for complete search history.

(56) References Cited

U.S. PATENT DOCUMENTS

2008/0193658 A1* 8/2008 Millward ...................... 427/401
2008/0217292 A1   9/2008 Millward et al.
2010/0316849 A1  12/2010 Millward et al.

FOREIGN PATENT DOCUMENTS

WO    2009/079241    6/2009
WO    2013/050338    4/2013

OTHER PUBLICATIONS

Internatinal Search Report mailed Jul. 5, 2013 in corresponding International Patent Application No. PCT/EP2013/055689.
(Continued)

*Primary Examiner* — Caleen Sullivan
(74) *Attorney, Agent, or Firm* — Pillsbury Winthrop Shawn Pittman LLP

(57) ABSTRACT

A method is disclosed to form a row of mutually spaced elongate lithography features along an axis on a substrate, for instance for use as contact electrodes for a NAND device. The method involves directing alignment of self-assemblable block copolymer (BCP) composition in a trench in a resist layer on the substrate, having the substrate as base, with an epitaxy feature in the trench to cause the ordered BCP layer to have elongate domains stretching across the trench width, substantially parallel to each other and to the substrate. The ordered BCP layer is then used as a resist to pattern the substrate. A BCP composition adapted to assemble with spaced discontinuous elongate elliptical domains is disclosed. The method may allow for sub-resolution contact arrays to be formed using UV lithography.

20 Claims, 8 Drawing Sheets

(51) Int. Cl.
*G03F 7/00* (2006.01)
*B82Y 10/00* (2011.01)
*B82Y 40/00* (2011.01)

(56) References Cited

OTHER PUBLICATIONS

Miri Park et al., "Block Copolymer Lithography: Periodic Arrays of ~$10^{11}$ Holes in 1 Square Centimeter," Science, vol. 276, pp. 1401-1404 (May 30, 1997).

Joy Y. Cheng et al., "Templated Self-Assembly of Block Copolymers: Effect of Substrate Topography," Adv. Matter, vol. 15, No. 19, pp. 1599-1602 (Oct. 2, 2003).

R. Tiron et al., "Self Assembly Patterning: Towards 300mm CMOS Requirements," LETI International Symposium on Lithography Extension 2011, pp. 1-25 (Oct. 20, 2011).

Li-Wen Chang et al., "Experimental Demonstration of Aperiodic Patterns of Directed Self-Assembly by Block Copolymer Lithography for Random Logic Circuit Layout," Institute of Electrical and Electronics Engineers (IEEE), pp. IEDM10-752-IEDM10-755 (2010).

\* cited by examiner

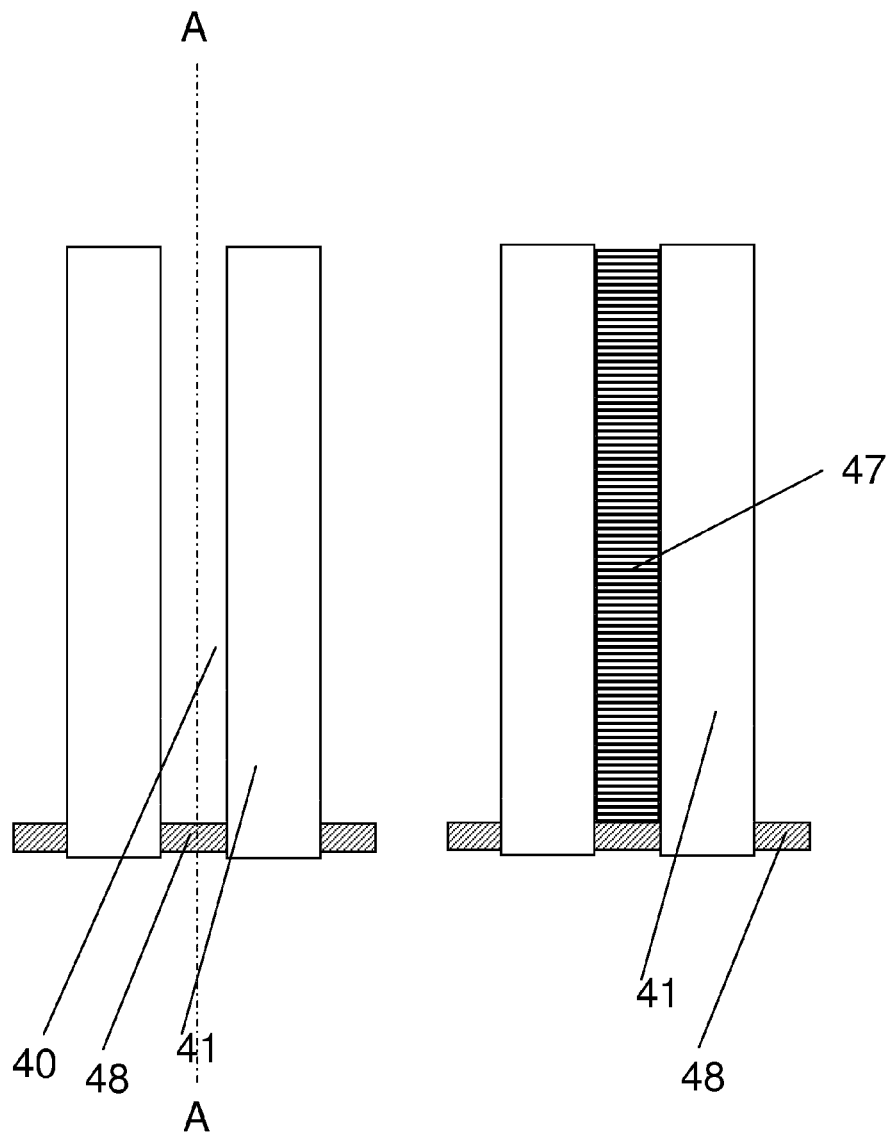

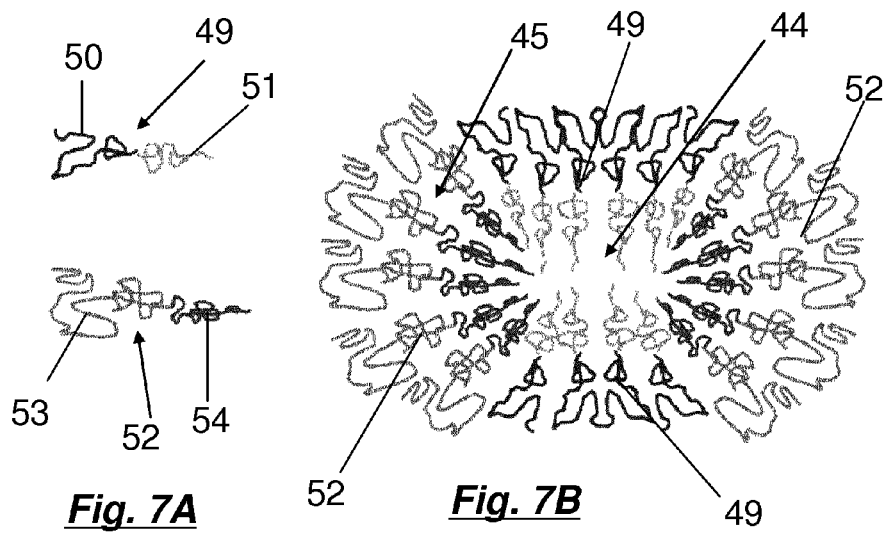
*Fig. 7A*  *Fig. 7B*
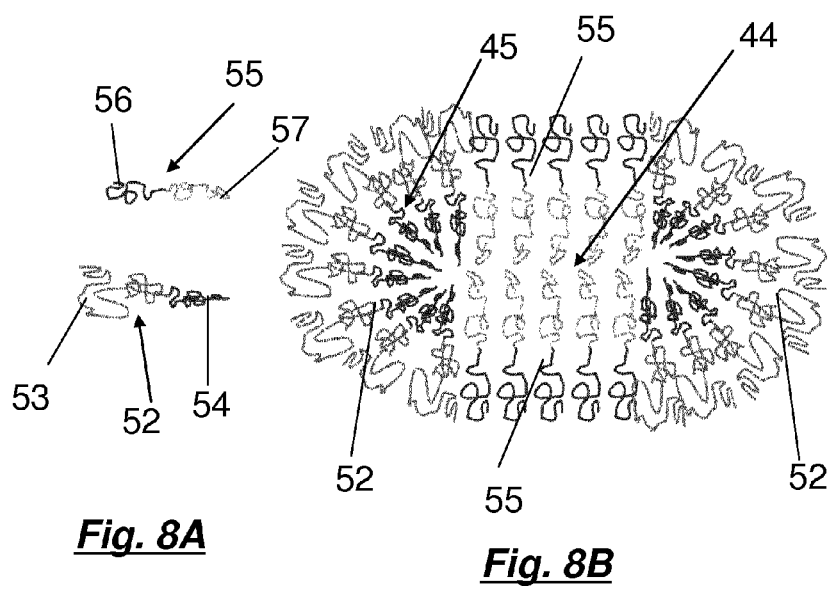
*Fig. 8A*  *Fig. 8B*

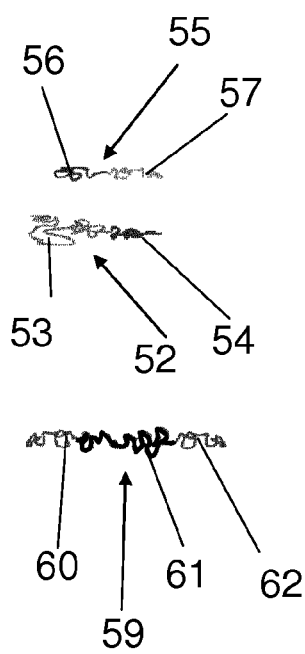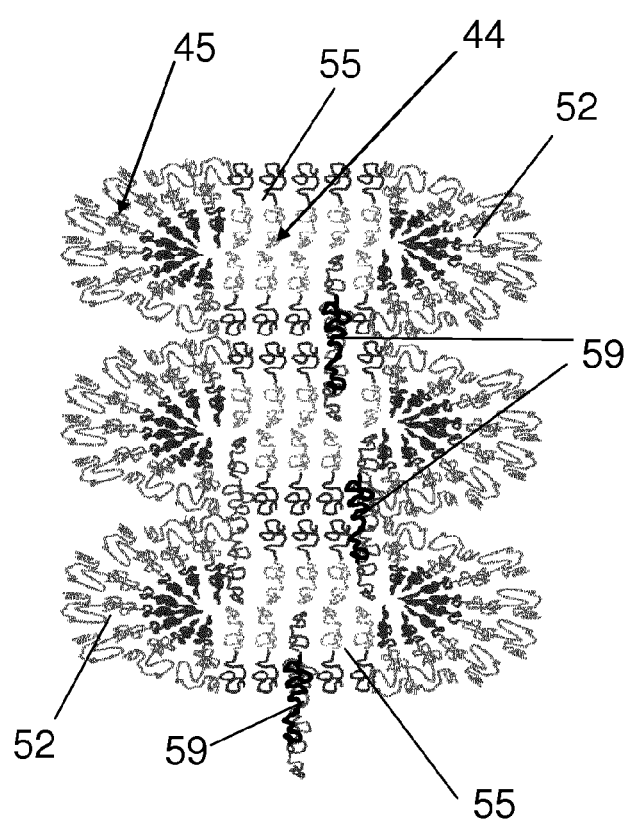
Fig. 9A
Fig. 9B

METHODS AND COMPOSITIONS FOR PROVIDING SPACED LITHOGRAPHY FEATURES ON A SUBSTRATE BY SELF-ASSEMBLY OF BLOCK COPOLYMERS

CROSS-REFERENCE TO RELATED APPLICATIONS

This application is the U.S. national phase entry of PCT patent application no. PCT/EP2013/055689, which was filed on Mar. 19, 2013, which claims the benefit of U.S. provisional application No. 61/639,586, which was filed on Apr. 27, 2012, which is incorporated herein in its entirety by reference.

FIELD

The present invention relates to a method of forming mutually spaced lithography features along an axis on a substrate by use of a self-assembly of block copolymer composition in a trench provided on the substrate to form rows of spaced elongate domains along the trench. The method may be useful to form a contact electrode array for a NAND device.

BACKGROUND

In lithography for device manufacture, there is an ongoing desire to reduce the size of features in a lithographic pattern in order to increase the density of features on a given substrate area. Patterns of smaller features having critical dimensions (CD) at nano-scale allow for greater concentrations of device or circuit structures, yielding potential improvements in size reduction and manufacturing costs for electronic and other devices. In photolithography, the push for smaller features has resulted in the development of technologies such as immersion lithography and extreme ultraviolet (EUV) lithography.

So-called imprint lithography generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

For both photolithography and for imprint lithography, it is desirable to provide high resolution patterning of surfaces, for example of an imprint template or of other substrates, and chemical resists may be used to achieve this.

The use of self-assembly of a block copolymer (BCP) has been considered as a potential method for improving the resolution to a better value than obtainable by prior art lithography methods or as an alternative to electron beam lithography for preparation of imprint templates.

A self-assemblable block copolymer is a compound useful in nanofabrication because it may undergo an order-disorder transition on cooling below a certain temperature (order-disorder transition temperature $T_{OD}$) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have a line width roughness of the order of about 1-5 nm and may be manipulated by modification of the chemical compositions of the blocks of the copolymers.

The feasibility of using thin films of block copolymers as self-assembling templates was demonstrated by Chaikin and Register, et al., Science 276, 1401 (1997). Dense arrays of dots and holes with dimensions of 20 nm were transferred from a thin film of poly(styrene-block-isoprene) to a silicon nitride substrate.

A block copolymer comprises different blocks, each typically comprising one or more identical monomers, and arranged side-by side along the polymer chain. Each block may contain many monomers of its respective type. So, for instance, an A-B block copolymer may have a plurality of type A monomers in the (or each) A block and a plurality of type B monomers in the (or each) B block. An example of a suitable block copolymer is, for instance, a polymer having covalently linked blocks of polystyrene (PS) monomer (hydrophobic block) and polymethylmethacrylate (PMMA) monomer (hydrophilic block). Other block copolymers with blocks of differing hydrophobicity/hydrophilicity may be useful. For instance a tri-block copolymer such as (A-B-C) block copolymer may be useful, as may an alternating or periodic block copolymer e.g. $[-A-B-A-B-A-B-]_n$ or $[-A-B-C-A-B-C]_m$ where n and m are integers. The blocks may be connected to each other by covalent links in a linear or branched fashion (e.g., a star or branched configuration).

A block copolymer may form many different phases upon self-assembly, dependent upon the volume fractions of the blocks, degree of polymerization within each block type (i.e. number of monomers of each respective type within each respective block), the optional use of a solvent and surface interactions. When applied in a thin film, the geometric confinement may pose additional boundary conditions that may limit the number of phases. In general spherical (e.g. cubic), cylindrical (e.g. tetragonal or hexagonal) and lamellar phases (i.e. self-assembled phases with cubic, hexagonal or lamellar space-filling symmetry) are practically observed in thin films of self-assembled block copolymers, and the phase type observed may depend upon the relative molecular volume fractions of the different polymer blocks.

Suitable block copolymers for use as a self-assemblable polymer include, but are not limited to, poly(styrene-b-methylmethacrylate), poly(styrene-b-2-vinylpyridone), poly(styrene-b-butadiene), poly(styrene-b-ferrocenyldimethylsilane), poly(styrene-b-ethyleneoxide), poly(ethyleneoxide-b-isoprene). The symbol "b" signifies "block" Although these are di-block copolymer examples, it will be apparent that self-assembly may also employ a tri-block, tetrablock or other multi-block copolymer.

The self-assembled polymer phases may orient with symmetry axes substantially parallel or substantially perpendicular to the substrate and lamellar and cylindrical phases are interesting for lithography applications, as they may provide a resist to form line and space patterns and hole arrays, respectively, when oriented with their domains lying side-by-side on a substrate, and may provide good contrast when one of the domain types is subsequently etched.

It will be understood a block copolymer composition comprising two or more differing block copolymer molecule types may be used for self-assembly.

Two methods used to guide or direct self-assembly of a polymer, such as a block copolymer, onto a surface are graphoepitaxy and chemical pre-patterning, also called chemical epitaxy. In the graphoepitaxy method, self-organization of block copolymer is guided by topological pre-patterning on the substrate. Lamellar self-assembled block copolymer can form substantially parallel linear patterns with adjacent lines of the different polymer block domains in the enclosures or trenches defined by one or more side walls of the graphoepitaxy template. For instance if the block copolymer is a di-block copolymer with A and B blocks within the polymer chain, where A is hydrophilic and B is hydrophobic in nature, the A blocks may assemble into domains formed adjacent to a side-wall of a trench if the side-wall is also hydrophilic in nature. Resolution may be improved over the resolution of the graphoepitaxy template by a side wall being spaced to fit several domains of the block copolymer side-by-side. For hexagonal or tetragonal (cylindrical) ordered patterns, the graphoepitaxy features may be pillars standing in place of cylindrical domains of the ordered pattern of the block copolymer.

In the chemical pre-patterning method (referred to herein as chemical epitaxy), the self-assembly of block copolymer domains is guided by a chemical pattern (i.e. a chemical epitaxy template) on the substrate. Chemical affinity between the chemical pattern and at least one of the types of copolymer blocks within the polymer chain may result in the precise placement (also referred to herein as "pinning") of one of the domain types onto a corresponding region of the chemical pattern on the substrate. For instance if the block copolymer is a di-block copolymer with A and B blocks, where A is hydrophilic and B is hydrophobic in nature, and the chemical epitaxy pattern may comprise a hydrophobic region on a hydrophilic surface, the B domain may preferentially assemble onto the hydrophobic region. As with the graphoepitaxy method of alignment, the resolution may be improved over the resolution of the patterned substrate by the block copolymer pattern subdividing the spacing of the pre-patterned features on the substrate (so-called density or pitch multiplication). As was the case with graphoepitaxy, chemical pre-patterning is not limited to a linear pre-pattern; for instance the chemical epitaxy template may be in the form of a 2-D array of dots suitable as a pattern for use with a cylindrical (e.g. hexagonal or square pattern) phase-forming block copolymer. Graphoepitaxy and chemical pre-patterning may be used, for instance, to guide the self-organization of lamellar or cylindrical phases, so that the different domain types are arranged side-by-side on a surface of a substrate.

Typically, the height of features of a graphoepitaxy template may be of the order of the thickness of the block copolymer layer to be ordered, so may be, for instance, from about 20 nm to about 150 nm whereas for a chemical epitaxy template, the height difference between adjacent regions of a chemical epitaxy template will typically be less than about 15 nm, say less than about 10 nm or even less than about 5 nm in order to reduce or minimize likelihood of defect formation.

SUMMARY

In a process to implement the use of block copolymer self-assembly in nanofabrication, a substrate may be modified with a neutral orientation control layer, as part of the chemical pre-pattern or graphoepitaxy template, to induce the preferred orientation of the self-assembly pattern in relation to the substrate. For some block copolymers used in self-assemblable polymer layers, there may be a preferential interaction between one of the blocks and the substrate surface that may result in orientation. For instance, for a polystyrene(PS)-b-PMMA block copolymer, the PMMA block will preferentially wet (i.e. have a high chemical affinity with) an oxide surface and this may be used to induce the self-assembled pattern to lie oriented substantially parallel to the plane of the surface.

Substantially perpendicular orientation may be induced, for instance, by depositing a neutral orientation layer onto the surface rendering the substrate surface neutral to both blocks, in other words the neutral orientation layer has a similar chemical affinity for each block, such that both blocks wet the neutral orientation layer at the surface in a similar manner. By "perpendicular orientation" it is meant that the domains of each block will be positioned side-by-side at the substrate surface, with the interfacial regions between adjacent domains of different blocks lying substantially perpendicular to the plane of the surface.

A neutral orientation surface for use in chemical epitaxy and graphoepitaxy is particularly useful. It may be used on surfaces between specific orientation regions of an epitaxy template. For instance in a chemical epitaxy template to align a di-block copolymer having A and B blocks, where A is hydrophilic and B is hydrophobic in nature, the chemical pattern may comprise hydrophobic pinning sites with a neutral orientation region between the hydrophobic sites. The B domain may preferentially assemble onto the hydrophobic pinning sites, with several alternating domains of A and B blocks aligned over the neutral region between the specific (pinning) orientation regions of the chemical epitaxy template.

For instance in a graphoepitaxy template to align such a di-block copolymer the pattern may comprise hydrophobic resist features as pillars or side-walls with a neutral orientation region between the hydrophobic resist features. The B domain may preferentially assemble alongside the hydrophobic resist features, with several alternating domains of A and B blocks aligned over the neutral orientation region between the pinning resist features of the graphoepitaxy template.

A neutral orientation layer may, for instance, be created by use of random copolymer brushes which are covalently linked to the substrate by reaction of a hydroxyl terminal group, or some other reactive end group, to oxide at the substrate surface. In other arrangements for neutral orientation layer formation, a crosslinkable random copolymer or an appropriate silane (i.e. molecules with a substituted reactive silane, such as a (tri)chlorosilane or (tri)methoxysilane, also known as silyl, end group) may be used to render a surface neutral by acting as an intermediate layer between the substrate surface and the layer of self-assemblable polymer. Such a silane based neutral orientation layer will typically be present as a monolayer whereas a crosslinkable polymer is typically not present as a monolayer and may have a layer thickness of typically less than or equal to about 40 nm, or less than or equal to about 20 nm. The neutral orientation layer may, for instance, be provided with one or more gaps therein to permit one of the block types of the self-assemblable layer to come into direct contact with the substrate below the neutral orientation layer. This may be useful for anchoring, pinning or aligning a domain of a particular block type of the self-assemblable polymer layer to the substrate, with the substrate surface acting as a specific orientation feature.

A thin layer of self-assemblable block copolymer may be deposited onto a substrate having a graphoepitaxy or chemical epitaxy template as set out above. A suitable method for deposition of the self-assemblable polymer is spin-coating, as this process is capable of providing a well defined, uniform, thin layer of self-assemblable polymer. A suitable layer thickness for a deposited self-assemblable polymer film is approximately 10 to 100 nm. Following deposition of the block copolymer film, the film may still be disordered or only partially ordered and one or more additional steps may be needed to promote and/or complete self-assembly. For instance, the self-assemblable polymer may be deposited as a solution in a solvent, with solvent removal, for instance by evaporation, prior to self-assembly.

Self-assembly of a block copolymer is a process where the assembly of many small components (the block copolymer) results in the formation of a larger more complex structure (the nanometer sized features in the self-assembled pattern, referred to as domains in this specification). Defects arise naturally from the physics controlling the self-assembly of the polymer. Self-assembly is driven by the differences in interactions (i.e. differences in mutual chemical affinity) between A/A, B/B and A/B (or B/A) block pairs of an A-B block copolymer, with the driving force for phase separation described by Flory-Huggins theory for the system under consideration. The use of chemical epitaxy or graphoepitaxy may greatly reduce defect formation.

For a polymer which undergoes self-assembly, the self-assemblable polymer will exhibit an order-disorder temperature $T_{OD}$. $T_{OD}$ may be measured by any suitable technique for assessing the ordered/disordered state of the polymer, such as differential scanning calorimetry (DSC). If layer formation takes place below this temperature, the molecules will be driven to self-assemble. Above the temperature $T_{OD}$, a disordered layer will be formed with the entropy contribution from disordered A/B domains outweighing the enthalpy contribution arising from favorable interactions between neighboring A-A and B-B block pairs in the layer. The self-assemblable polymer may also exhibit a glass transition temperature $T_g$ below which the polymer is effectively immobilized and above which the copolymer molecules may still reorient within a layer relative to neighboring copolymer molecules. The glass transition temperature is suitably measured by differential scanning calorimetry (DSC).

Defects formed during ordering as set out above may be partly removed by annealing. A defect such as a disclination (which is a line defect in which rotational symmetry is violated, e.g. where there is a defect in the orientation of a director) may be annihilated by pairing with other another defect or disclination of opposite sign. Chain mobility of the self-assemblable polymer may be a factor for determining defect migration and annihilation and so annealing may be carried out at a temperature where chain mobility is high but the self-assembled ordered pattern is not lost. This implies temperatures up to a few ° C. above or below the order/disorder temperature $T_{OD}$ for the polymer.

Ordering and defect annihilation may be combined into a single annealing process or a plurality of processes may be used in order to provide a layer of self-assembled polymer such as block copolymer, having an ordered pattern of domains of differing chemical type (of domains of different block types), for use as a resist layer for lithography.

In order to transfer a pattern, such as a device architecture or topology, from the self-assembled polymer layer into the substrate upon which the self-assembled polymer is deposited, typically a first domain type will be removed by so-called breakthrough etching to provide a pattern of a second domain type on the surface of the substrate with the substrate laid bare between the pattern features of the second domain type.

Following the breakthrough etching, the pattern may be transferred by so-called transfer etching using an etching means which is resisted by the second domain type and so forms recesses in the substrate surface where the surface has been laid bare.

It would be desirable to have a process and method to form mutually spaced lithography features along an axis on a substrate by use of self-assembly of a block copolymer composition to form rows of spaced elongate domains along the trench. In particular, such a method may be desirable for forming a contact electrode array for a NAND device by using the spaced elongate domains as resist features to pattern the substrate.

It is desirable that the pattern features should be of small size (width or diameter measured along the trench of say about 30 nm or less, such as about 10 to about 20 nm) and that the spacing between adjacent features should be as small as possible—say having a periodic spacing of about 50 nm or less, such as about 30 nm or less. The depth of the pattern features may be about 20 to about 50 nm.

It is desirable, for example, to provide a simple method for providing such lithography features on a substrate surface. It is desirable, for example, to provide a self-assembled layer of block copolymer composition for subsequent use as a resist layer suitable for use in device lithography for forming mutually spaced elongate features. It is desirable, for example, to provide a method using photolithography, for instance with actinic radiation such as UV or DUV radiation, to form a template for directing self-assembly of the block copolymer composition.

It is desirable, for example, to provide a composition of self-assemblable block copolymer which is adapted to self-assemble into an ordered pattern having elongate domains, such as elliptical domains, mutually spaced with their major axes lying mutually parallel in an ordered, self-assembled pattern.

It is desirable, for example, to provide mutually spaced elongate lithography features with small pattern feature size and spacing compared to prior mutually spaced elongate lithography features prepared using resist-based photolithography.

According to an aspect of the invention, there is provided a method of forming a row of mutually spaced elongate lithography features along a substrate axis on a substrate, the method comprising providing a ordered layer of self-assemblable block copolymer composition on the substrate by:
 providing a resist layer on the substrate,
 forming a trench through the resist layer, over the substrate axis, aligned with its length lying substantially parallel to the substrate axis, having a side-wall of resist and a base of substrate bared of resist,
 providing a layer self-assemble block copolymer composition in the trench,
 causing the self-assemblable block copolymer composition to self-assemble to give an ordered layer of self-assembled block copolymer composition in the trench,
 wherein the block copolymer composition is adapted to form an ordered layer comprising first elongate domains, defining long axes substantially parallel to their greatest widths, self-assembled side-by-side on the substrate, alternating with a second domain therebetween, wherein the long axes of the elongate domains lie parallel to each other, and parallel to the substrate, and
 wherein an epitaxial feature is provided in the trench to direct self-assembly of the block copolymer composition such that the long axes of the elongate domains lie substantially normal to the substrate axis; and
using the ordered layer of self-assembled block copolymer composition as a further resist layer to provide the mutually spaced elongate lithography features on the substrate.

According to an aspect of the invention, there is provided a self-assemblable block copolymer composition for use in a method described herein. The self-assemblable block copolymer composition is adapted to form an ordered layer on a substrate, the ordered layer comprising discontinuous first elongate elliptical domains, defining long axes substantially parallel to their greatest widths, self-assembled side-by-side alternating with a second domain therebetween, wherein the long axes of the elongate domains lie substantially parallel to each other, and substantially parallel to the substrate, wherein the self-assemblable block copolymer composition comprises:

a first di-block copolymer having a first block of first monomer and a second block of second monomer, and a second di-block copolymer having a first block of the first monomer and a second block of the second monomer, wherein the first di-block copolymer is configured to self-assemble with lamellar packing geometry with the first block assembled in bodies of the discontinuous first elongate elliptical domains and the second block assembled in the second domain, and wherein the second di-block copolymer is configured to self-assemble with circular packing geometry with the first block assembled in ends of the discontinuous first elongate elliptical domains and the second block assembled in the second domain.

The following features are applicable to all the various aspects of the invention where appropriate. When suitable, combinations of the following features may be employed as part of the embodiments of the invention, for instance as set out in the claims. An embodiment of the invention is particularly suitable for use in device lithography. For instance, an embodiment of the invention may be of use in patterning a device substrate directly or may be of use in patterning an imprint template for use in imprint lithography.

The self-assemblable block copolymer composition may be a block copolymer composition as set out hereinbefore comprising at least two different block types, referred to as first and second polymer blocks, which are self-assemblable into an ordered polymer layer having the different block types associated into first and second domain types. The block copolymer composition may comprise a di-block copolymer and/or tri-block or multi-block copolymers. An alternating or periodic block copolymer may also be used as the self-assemblable polymer. Although only two domain types may be mentioned in some of the following aspects and examples, an embodiment of the invention is also applicable to a self-assemblable polymer with three or more different domain types. The self-assemblable block copolymer is desirably a di-block copolymer.

By "chemical affinity", in this specification, is meant the tendency of two differing chemical species to associate together. For instance chemical species which are hydrophilic in nature have a high chemical affinity for water whereas hydrophobic compounds have a low chemical affinity for water but a high chemical affinity for an alkane. Chemical species which are polar in nature have a high chemical affinity for other polar compounds and for water whereas apolar, non-polar or hydrophobic compounds have a low chemical affinity for water and polar species but may exhibit high chemical affinity for other non-polar species such as an alkane or the like. The chemical affinity is related to the free energy associated with an interface between two chemical species: if the interfacial free energy is high, then the two species have a low chemical affinity for each other whereas if the interfacial free energy is low, then the two species have a high chemical affinity for each other. Chemical affinity may also be expressed in terms of "wetting", where a liquid will wet a solid surface if the liquid and surface have a high chemical affinity for each other, whereas the liquid will not wet the surface if there is a low chemical affinity. Chemical affinities of surfaces may be measured, for instance, by means of contact angle measurements using various liquids, so that if one surface has the same contact angle for a liquid as another surface, the two surfaces may be said to have substantially the same chemical affinity for the liquid. If the contact angles differ for the two surfaces, the surface with the smaller contact angle has a higher chemical affinity for the liquid than the surface with the larger contact angle.

By "chemical species" in this specification is meant either a chemical compound such as a molecule, oligomer or polymer, or, in the case of an amphiphilic molecule (i.e. a molecule having at least two interconnected moieties having differing chemical affinities), the term "chemical species" may refer to the different moieties of such molecules. For instance, in the case of a di-block copolymer, the two different polymer blocks making up the block copolymer molecule are considered as two different chemical species having differing chemical affinities.

Throughout this specification, the term "comprising" or "comprises" means including the component(s) specified but not to the exclusion of the presence of others. The term "consisting essentially of" or "consists essentially of" means including the components specified but excluding other components except for materials present as impurities, unavoidable materials present as a result of processes used to provide the components, and components added for a purpose other than achieving the technical effect of the invention. Typically, a composition consisting essentially of a set of components will comprise less than 5% by weight, typically less than 3% by weight, more typically less than 1% by weight of non-specified components. The terms "consist of" or "consisting of" mean including the components specified but excluding the deliberate addition of other components.

Whenever appropriate, the use of the term "comprises" or "comprising" may also be taken to include the meaning "consist of" or "consisting of", "consists essentially of" or "consisting essentially of".

In this specification, when reference is made to the thickness of a feature, the thickness is suitably measured by an appropriate means along an axis substantially normal to the substrate surface and passing through the centroid of the feature. Thickness may suitably be measured by a technique such as interferometry or assessed through knowledge of etch rate.

Wherever mention is made of a "layer" in this specification, the layer referred to is to be taken to be layer of substantially uniform thickness, where present. By "substantially uniform thickness" is meant that the thickness does not vary by more than 10%, desirably not more than 5% of its average value across the layer.

By "bonding" or "linking" as referred to herein, it is meant that a bond such as a covalent bond, ionic bond or hydrogen bond is present, either within a molecule, or between a surface and a molecule, i.e. a bond stronger than mere van der Waals attraction. Desirably, the bonding or linking referred to herein is covalent or ionic bonding, more desirably covalent bonding.

References to molecular weight herein should be taken to refer to number average molecular weight as measured experimentally by gel permeation chromatography or the like. References to molecular volume are to be understood as molecular volume of the various moieties mentioned which are impenetrable to other molecules as estimated using bond lengths from x-ray diffraction studies and van der Waals radii from gas phase data.

In an embodiment, the method involves providing a resist layer on the substrate. The resist layer forms an interface with the substrate and also has an outer face opposed to the interface (in other words, on the opposite side of the resist layer to the interface with the substrate). The resist layer may be provided by any suitable method, such as spin coating of a resist solution in a solvent followed by evaporative drying to provide the resist layer on the substrate. Typically, the resist layer may be a positive tone resist. By a positive tone resist, is meant a resist which, once exposed to actinic radiation, becomes or is rendered soluble in a solvent so that when subjected to rinsing with the solvent, an exposed portion of the resist is washed away while an unexposed portion of the resist remain insoluble in the solvent. However, an embodiment of the invention may be put into effect by use of a negative tone resist, selectively exposed in an appropriate manner.

A trench is formed through the resist layer, over the substrate axis, aligned with its length lying substantially parallel to the substrate axis, having opposed side-walls of resist and a base of substrate, bared of resist. This is typically achievable by selective exposure of the resist to actinic radiation, such as UV radiation, followed by removal of the exposed (positive tone resist) or unexposed (negative tone resist) regions. The actinic radiation may be UV radiation such as DUV (deep UV) or EUV (extreme UV). The selective exposure to actinic radiation may be by patterning of the UV radiation with a lithography apparatus. A conventional lithographic patterning method such as mask or maskless UV lithography may be used to provide a desired high resolution exposure pattern on the resist layer to give the exposed and unexposed regions. Typical DUV lithography is carried out using UV radiation having a wavelength of about 193 nm. If appropriate, the remaining resist may be exposed to actinic radiation, after removal of the exposed resist layer, to provide the remaining resist with a modified chemical affinity, e.g., to render it hydrophilic, hydrophobic or neutral. Suitably, the trench has a width of about 100 nm or less such as about 50 nm or less (measured normal to the substrate axis at the trench's greatest width).

The substrate may typically be a semiconductor substrate, and may comprise a plurality of layers forming the substrate. For instance, the outermost layer of the substrate upon which the resist layer is provided, may be an ARC (anti-reflection coating) layer. Suitably, the outermost layer of the substrate is neutral to the domains of the block copolymer composition, by which it is meant that it has a similar chemical affinity for each of the domain types of the block copolymer composition.

A layer of self-assemblable block copolymer composition is then provided in the trench. This may be carried out by spin coating of the block copolymer composition from a solution followed by removal of solvent, for instance. The self-assemblable block copolymer composition is subsequently caused to self-assemble (for instance by bringing the temperature to a temperature less than To/d for the block copolymer composition, but above its glass transition temperature) to give an ordered layer of self-assembled block copolymer composition in the trench.

The block copolymer composition is adapted to form an ordered layer comprising first elongate domains, defining long axes substantially parallel to their greatest widths, self-assembled side-by-side on the substrate, alternating with second domain therebetween, wherein the long axes of the elongate domains lie substantially parallel to each other, and substantially parallel to the substrate.

In the method, one or more epitaxial features are provided in the trench (for instance either as part of the side-walls of the trench, on the bared substrate or as one or more transverse walls of the trench) to direct self-assembly of the block copolymer composition such that the long axes of the elongate domains lie substantially normal to the substrate axis.

In an embodiment, the method further involves using the ordered layer of self-assembled block copolymer composition as a resist layer to provide the lithography features, in the form of a row of mutually spaced elongate lithography features along the substrate axis on the substrate. The lithography features, arising from use of the ordered layer of block copolymer composition, will be elongate lithography features having long axes lying substantially normal to (i.e. across) the substrate axis, as is also the case for the first elongate domains, used in patterning the substrate to form the lithography features.

The first elongate domains may be discontinuous, elliptical domains and the second domain may be a continuous domain. By this it is meant that the first elongate domains are formed individually and separate from each other in the ordered pattern, whereas the second domain is interconnected throughout its extent so that a continuous (but possibly tortuous) path may be taken between any two spaced locations in the second domain, through the second domain, without having to pass through a first domain. The term "elliptical" is not meant to be interpreted in a limited manner, and includes any oval or cigar shape having a roughly lamellar or rectangular central body with rounded ends.

As mentioned above, an aspect of the invention provides a self-assemblable block copolymer composition for use in a method described herein.

Suitably, the self-assemblable block copolymer composition may comprise:

a first di-block copolymer having a first block of first monomer and a second block of second monomer, and a second di-block copolymer having a first block of the first monomer and a second block of the second monomer, wherein the first di-block copolymer is configured to self-assemble with lamellar packing geometry with the first block assembled in bodies of the elliptical domains and the second block assembled in the second domain, and wherein the second di-block copolymer is configured to self-assemble with circular packing geometry with the first block assembled in ends of the elliptical domains and the second block assembled in the second domain.

For instance, the ratio of molar volume of first to second blocks may be about 3:7, such as from 1:4 to 2:3, for each of the first and second di-block copolymers, wherein the molecular weight of the first di-block copolymer is less than the molecular weight of the second di-block copolymer. Typically, the molecular weight of the first di-block copolymer may be from about 50% to about 90% of that of the second di-block copolymer, for instance from about 60% to about 80%. The molar ratio of first di-block copolymer to second di-block copolymer in the composition is suitably from about 1:4 to about 4:1, say from about 1:2 to about 2:1 such as about 1:1.

For another suitable block copolymer composition, the ratio of molar volume of first to second blocks may be about 1:1 for the first di-block copolymer, such as from 2:2 to 3:2, and the ratio of molar volume of first to second blocks may be from 2:3 to 1:4 for the second di-block copolymer. For this composition, the first block of the first di-block copolymer suitably has a molecular weight from 80 to 120% of the molecular weight of the first block of the second di-block copolymer, for instance about the same molecular weight. The molar ratio of first di-block copolymer to second di-block copolymer in the composition is suitably from about 1:4 to about 4:1, say from about 1:2 to about 2:1 such as about 1:1.

The self-assemblable block copolymer compositions, such as those described hereinbefore, may further comprise from about 5 to about 30% by weight of an oligomer of the first monomer, such as about 10% by weight, calculated as a percentage of the total weight of polymer in the block copolymer composition, wherein the molecular weight of the oligomer is from about 5% to about 80% of the molecular weight of the first block of the first di-block copolymer, such as about 10% to about 30% of the molecular weight of the first block of the first di-block copolymer.

The self-assemblable block copolymer compositions, such as those described hereinbefore, may further comprise a tri-block copolymer, for instance from about 5 to about 20% by weight of the total polymer in the composition, wherein the tri-block copolymer comprises a moiety as for the second di-block copolymer, but with a third block of first monomer at an opposite end of the second block to the first block of the moiety, the molecular weight of the third block being from about 10% to about 80% of the molecular weight of the first block of the moiety. This type of tri-block copolymer is referred to herein as a first type of tri-block copolymer.

The self-assemblable block copolymer compositions, such as those described hereinbefore, may further comprise a second type of tri-block copolymer having first and third terminal blocks, for instance from about 5 to about 20% by weight of the total polymer in the composition, of the same monomer and substantially the same molecular weight as the first block of the first di-block copolymer, and a second central block of the same monomer as the second block of the first di-block copolymer, but a molecular weight of about 180 to 400%, say about 300%, of that of the second block of the first di-block copolymer.

It may be that the block copolymer composition used contains only one of the oligomer, the first type of tri-block copolymer or the second type of tri-block copolymer, or it may comprise any two in combination, or all three.

For the method, the epitaxial feature may comprise a recess in one or more of the opposed side-walls of the trench.

For instance, the resist layer may be of a positive tone resist, wherein the trench is formed by:

selectively exposing the resist layer to actinic radiation to expose a pattern of overlapping ellipses having major axes lying mutually substantially parallel to each other and substantially normal to the substrate axis, and removing the exposed resist layer to leave a trench having a base of substrate bared of resist and the recessed opposed side-walls.

By "ellipses" is meant oval shapes with a major axis typically longer than a minor axis, for instance with the major axis from 1.3 to 4 times the length of the corresponding minor axis, but the ellipses may also be approximately circular in shape. The term is not meant to limit the oval shapes to be mathematically perfect ellipses.

In another arrangement, rather than the first elongate domains being discontinuous elliptical domains, the block copolymer composition may instead be adapted to form an ordered layer which is a lamellar ordered layer wherein the first elongate domains are lamellae alternating with second domains which are also lamellae, the lamellae of the first and second domains oriented with their planar surfaces lying substantially normal to the substrate and substantially normal to the substrate axis. This block copolymer composition may be referred to as a lamellar block-copolymer composition herein. Suitably, for this arrangement, the side-walls of the trench will be adapted to be neutral to the first and second domains, meaning that the side-walls have a similar chemical affinity for each of the first and second domains. Also, for this arrangement, the outermost layer of the substrate, forming the base of the trench, is suitably neutral to the domains of the block copolymer composition, by which it is meant that it has a similar chemical affinity for each of the domain types of the block copolymer composition.

The epitaxy feature for such a lamellar block copolymer composition may comprise a graphoepitaxy template, the graphoepitaxy template comprising a transverse wall of the trench, having a face with a higher chemical affinity for one of the first and second domains than for the other of the first and second domains, the transverse wall lying across the trench with the face substantially normal to the substrate and substantially normal to the substrate axis. The transverse wall may be an end wall of the trench. The transverse wall may be formed during the same process used to form the trench, or may be provided in a separate process step (such as conventional UV, DUV, EUV or electron beam lithography).

Alternatively or additionally, the epitaxy feature for the lamellar block copolymer composition may comprise a chemical epitaxy template comprising a pinning stripe on the base of the trench, the stripe lying across the trench, on the substrate, substantially normal to the substrate axis, and the pinning stripe having a higher chemical affinity for one of the first and second domains than for the other of the first and second domains. Such a chemical epitaxy template may be deposited using a conventional DUV or EUV or electron beam lithography technique prior to deposition of the resist layer used for forming the trench. Alternatively, such chemical epitaxy template may be put in place after the trench has been formed but before providing the block copolymer composition into the trench.

Although reference is made to a single chemical epitaxy pinning stripe, it will be understood that multiple, mutually spaced, substantially parallel pinning stripes may be provided. Typically, such a chemical epitaxy template may comprise narrow pinning stripes spaced apart by a neutral region. The patterned chemical epitaxy template may have the same periodicity (i.e. unit cell pitch) as the self-assembled lamellar block copolymer composition that it is intended to direct during self-assembly, or the periodic spacing between adjacent pining sites will correspond to a plurality of unit cells for the self-assembled polymer composition. This allows for the effect known as density multiplication (sometimes also referred to as pitch multiplication). So, for instance, using an example of a lamellar self-assembled block copolymer phase, having domains of width W1 for the first block and width W2 for the second block, the unit cell period or pitch of the self-assembled polymer will be W1+W2. For the patterned chemical epitaxy template, if this has the same pitch, then it would have alternating pinning features having width W1 and neutral regions having width W2, each region arranged for chemical affinity with (or neutrality to) the corresponding polymer blocks.

Another suitable arrangement may have, for instance, pinning sites of width W1, having high chemical affinity for one of the blocks, separated by broader stripes of neutral region of width [n·(W2+W1)+W2], where n is an integer of value 1 or more, such as from 1 to 20, or 1 to 10, for instance 1, 2, 3, 4, 5, 6, 7, 8, 9 or 10, with the unexposed region having similar chemical affinity (i.e. neutral chemical affinity) for first and second blocks.

In fact, the width of the pinning features may be, say from 0.4 W1 to 1.5 W1 (i.e. near to but not necessarily exactly W1) provided that the periodicity of the first regions corresponds to n·[W1+W2], where n is an integer as already set out. In other words, it is not essential that the narrowest pinning features of the chemical epitaxy pattern have exactly the same dimension as the corresponding domain of the self-assembled polymer.

The mutually spaced elongate lithography features may be of highly conductive material in recesses on the substrate, formed by:

removing the first domains by breakthrough etching to provide a pattern of the second domain on the surface of the substrate, in the trench, with the substrate laid bare between the pattern features of the second domain, transferring the pattern by transfer etching, using an etchant which is resisted by the second domain, to form recesses in the substrate, and providing the highly conductive material in the recesses.

The method may be used to provide lithography features which are contact electrodes for a NAND device. For instance, the lithography features may be contact pads of a highly conductive material such as metal, deposited into holes formed using the elongate domains as removed resist features. In order to transfer a pattern from the ordered self-assembled polymer layer into the substrate, typically the first domain will be removed by so-called breakthrough etching to provide a pattern of the second domain on the surface of the substrate, in the trench, with the substrate laid bare between the pattern features of the second domain.

Following the breakthrough etching, the pattern may be transferred by so-called transfer etching using an etchant which is resisted by the second domain and so forms recesses in the substrate surface where the surface has been laid bare.

Hence, according to an aspect of the invention, there is provided a NAND device comprising contact electrodes obtained or obtainable by a method described herein, wherein the lithography features are contact electrodes for a NAND device.

BRIEF DESCRIPTION OF THE DRAWINGS

Specific embodiments of the invention will be described with reference to the accompanying Figures, in which:

FIGS. 6A and 6B schematically depict stages in a process according to an embodiment of the invention using a lamellar block copolymer composition and graphoepitaxy;

FIGS. 7A and 7B show schematic diagrams of a block copolymer composition according to an embodiment of the invention, adapted to form discontinuous elliptical domains, for use in a method described herein;

FIGS. 8A and 8B show schematic diagrams of a block copolymer composition according to an embodiment of the invention, adapted to form discontinuous elliptical domains, for use in a method described herein;

FIGS. 9A and 9B show schematic diagrams of a block copolymer composition according to an embodiment of the invention, adapted to form discontinuous elliptical domains, for use in a method described herein.

DETAILED DESCRIPTION

The described and illustrated embodiments are to be considered as illustrative and not restrictive in character, it being understood that only preferred embodiments have been shown and/or described and that all changes and modifications that come within the scope of the inventions as defined in the claims are desired to be protected.

Figure 1A:
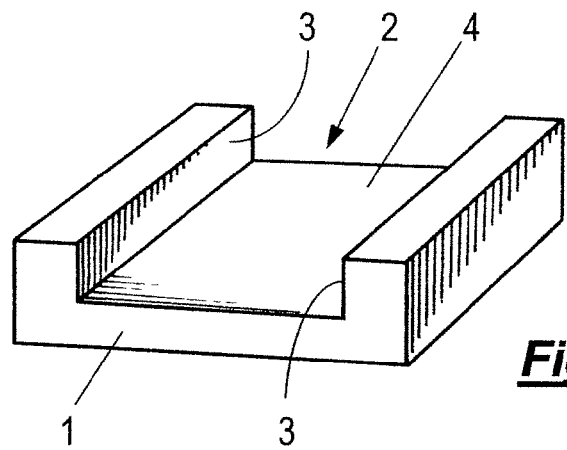
FIG. 1A to 1C schematically depict directed self-assembly of A-B block copolymer onto a substrate by graphoepitaxy and formation of relief patterns by selective etching of one domain.
Figure 1B:
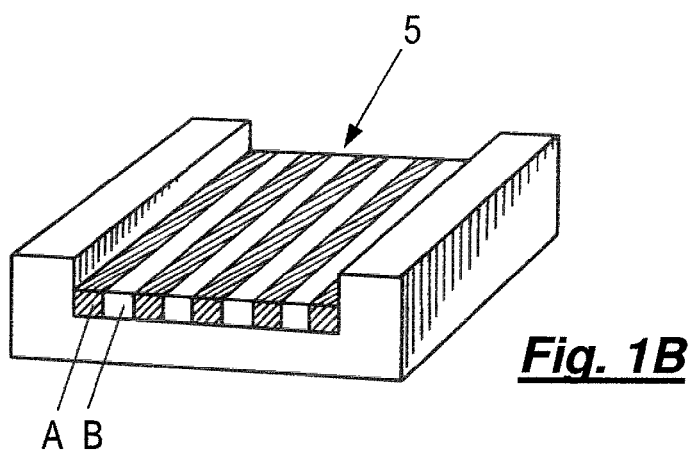
Figure 1C:
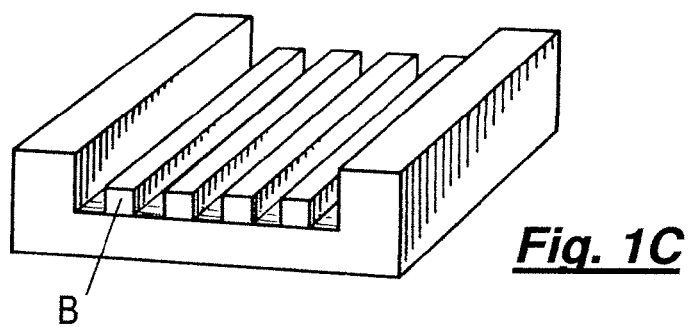

FIG. 1A shows a substrate 1 with a trench 2 formed therein bounded by side walls 3 and a bottom surface 4. In FIG. 1B, a self-assemblable A-B block copolymer with, e.g., hydrophilic A blocks and, e.g., hydrophobic B blocks has been deposited into the trench to form a layer 5 with alternating stripes of A and B domains which have deposited as a lamellar phase separated into discrete micro-separated periodic domains during deposition of the block copolymer. This is referred to as graphoepitaxy. The type A domains have nucleated adjacent to the a side wall 3, which is also, e.g., hydrophilic. In FIG. 1C, the type A domains have been removed by selective chemical etching, leaving the type B domains to form a relief pattern in the trench where they may serve as a template for subsequent patterning of the bottom surface 4, for instance by further chemical etching. Selective removal may be achieved, for instance, by selective photo-degradation or photo-cleavage of a linking agent between blocks of the copolymer and subsequent solubilization of one of the blocks. The pitch or wavelength of the self-assembled polymer structure 5 and the width of the trench 4 are arranged so that a number of alternating stripes of domains can fit into the trench with a type A domain against each side wall.

Figure 2A:
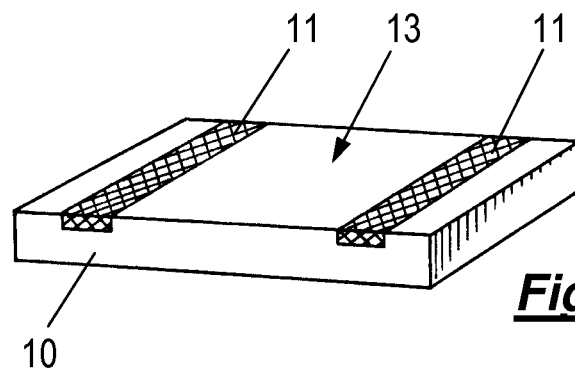
FIGS. 2A to 2C schematically depict directed self-assembly of A-B block copolymer onto a substrate by chemical epitaxy and formation of relief patterns by selective etching of one domain.
Figure 2B:
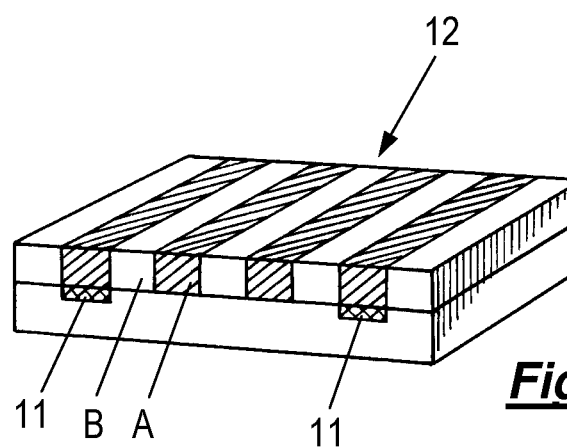
Figure 2C:
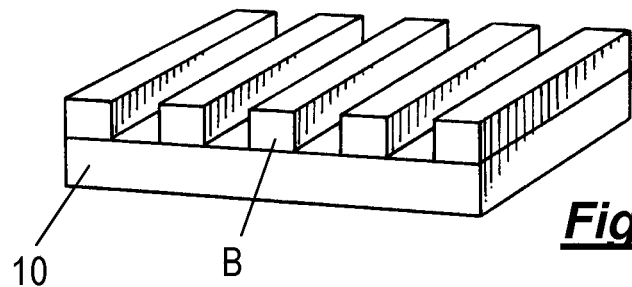

FIG. 2A shows a substrate 10 with a chemical pattern in the form of pinning stripes 11 which have been chemically formed on the surface 13 to provide regions with a higher affinity for the type A blocks of the polymer. In FIG. 2B, a self-assemblable A-B block copolymer with, e.g., hydrophilic A blocks and, e.g., hydrophobic B blocks has been deposited onto the surface 13 of substrate 10 to form a lamellar phase layer 12 with alternating stripes of A and B domains which have phase separated into discrete micro-separated periodic domains during deposition of the block copolymer. This is referred to as chemical pre-patterning or chemical epitaxy. The type A domains have nucleated atop the pinning or nucleation stripes 11, which are also, e.g., hydrophilic. In FIG. 2C, the type A domains have been removed by selective chemical etching, leaving the type B domains to form a relief pattern on the surface 13 where they may serve as a template for subsequent patterning of surface 13, for instance by further chemical etching. The pitch or wavelength of the self-assembled polymer structure 12 and the spacing of the pinning stripes 11 are arranged so that a number of alternating stripes of domains can fit between the pinning stripes 11 with a type A domain atop each pinning stripe 11.

Figure 3A:
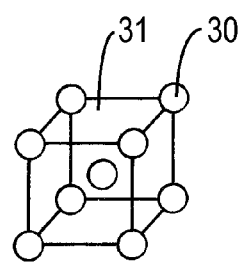
FIGS. 3A to 3E schematically depict the different phases formed by a poly(styrene-b-methylmethacrylate) polymer as the relative volume fractions of the polystyrene and PMMA blocks are varied relative to each other.
Figure 3B:
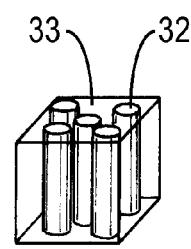
Figure 3C:
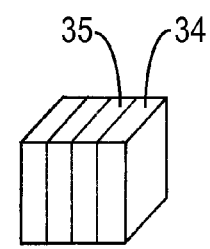
Figure 3D:
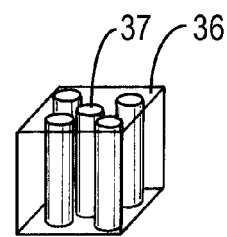
Figure 3E:
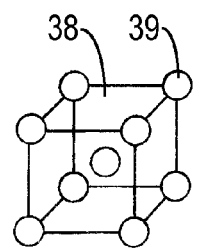

FIGS. 3A to 3E show the progression of different phases formed by self-assembled poly(styrene-b-methylmethacrylate) block copolymer in a thin film on a surface. In FIG. 3A, a cubic phase is shown with the discontinuous domains being spheres of PMMA within a continuous domain of PS for a ratio PS:PMMA of 80:20. As the ratio PS:PMMA reduces to 70:30, a cylindrical phase formed with the discontinuous domains being cylinders of PMMA. At 50:50 ratio, a lamellar phase is formed as shown in FIG. 3C. With a ratio of 30:70 PS:PMMA, an inverted cylindrical phase is formed, shown in FIG. 3D, with the discontinuous domains being of PS and at a ratio of 20:80, shown in FIG. 3E, an inverted cubic phase is formed.

In the following examples, the di-block copolymer used as self-assemblable polymer in the composition is a poly(styrene-b-methylmethacrylate) block copolymer, denoted by the acronym PS/PMMA, arranged for self-assembly as explained herein. However, the method is also applicable to other self-assemblable block copolymers comprising different monomer types.

Figures 4A, 4B:
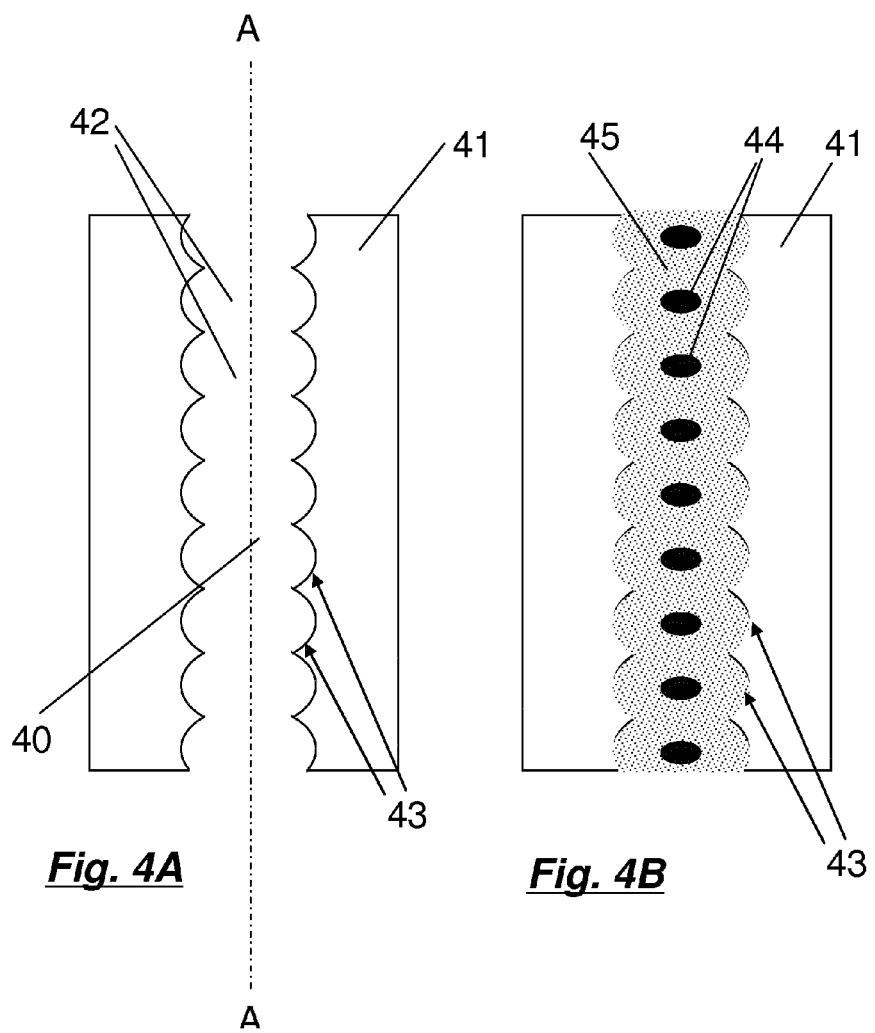
FIGS. 4A and 4B schematically depict stages in a process according to an embodiment of the invention, using a block copolymer composition adapted to self assemble into an ordered pattern having discontinuous elliptical domains.

FIGS. 4A and 4B show schematically the sequential stages of a process according to an embodiment of the invention. Each Figure represents a plan view of a substrate 40 having a positive tone resist layer 41 deposited on its surface. In FIG. 4A the resist layer 41 is shown after it has been exposed to UV radiation to expose a row of overlapping ellipse-shaped regions 42, side by side along a substrate axis A-A, the ellipses thus exposed having their major axes (i.e. greatest widths) arranged to lie substantially normal to the substrate axis A-A. The exposed resist has been washed away using a solvent effective to dissolve exposed resist, leaving unexposed resist in place, to provide a trench running along the substrate axis A-A, with substrate 40, bared of resist 41, forming the base of the trench and side walls with scalloped features 43 as recesses in the opposed side-walls of the trench. For a typical positive tone resist, such as the resist used for this embodiment, the exposed resist is hydrophilic in nature whereas the unexposed resist is hydrophobic in nature. However, as explained herein, the chemical affinity of the side-walls may be modified, after formation of the trench, by flood exposure to actinic radiation, or, for instance, by deposition of a neutral orientation layer onto the side-walls of the resist.

In FIG. 4B, an ordered, self-assembled layer of block copolymer composition is shown deposited and assembled on the surface of the substrate, in the trench with self-assembly graphoepitaxially directed by the regular pattern of recesses 43 in the side-walls of the trench. The bared substrate 40 between the side-walls of the trench is neutral in nature with respect to each of the domains (continuous domain 45 and elongate discontinuous domains 44) of the block copolymer composition, and so has a similar chemical affinity for each block or domain of the block copolymer. This permits the ordered block copolymer composition to self-assemble with the alternating domains 44, 45 positioned side-by-side on the neutral surface the substrate, with the overall positioning and orientation of the ordered block copolymer pattern controlled by the graphoepitaxy template of the resist side-walls of the trench with its recesses 43 acting to locate the domains 44, 45 of the ordered pattern in place by acting as a graphoepitaxy template. The elongate domains 44 may for instance be subsequently removed during a selective etch process leaving continuous domain 45 in place, following solidification of the ordered pattern, in order to provide a template for deposition of elongate metal contacts in the holes left by the elongate domains 44, mutually spaced along the substrate axis.

Figures 5A, 5B:
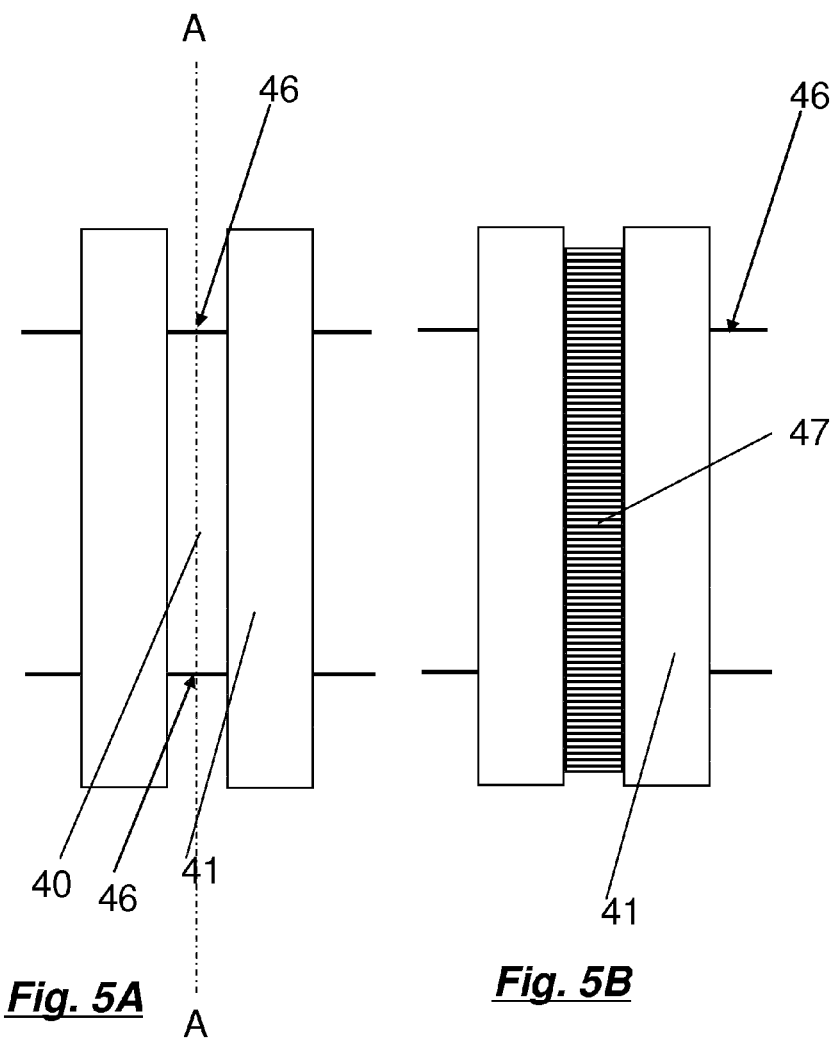
FIGS. 5A and 5B schematically depict stages in a process according to an embodiment of the invention using a lamellar block copolymer composition and chemical epitaxy.

FIGS. 5A and 5B schematically depict stages in a process according to an embodiment of the invention using a lamellar block copolymer composition and chemical epitaxy to direct the self-assembly of the block copolymer composition.

Each Figure again represents a plan view of a substrate 40 having a positive tone resist layer 41 deposited on its surface. In FIG. 5A the resist layer 41 is shown after it has been exposed to UV radiation to expose a trench with straight, substantially parallel sidewalls lying along substrate axis A-A, with substrate 40, bared of resist 41, forming the base of the trench.

Prior to deposition of the resist layer and trench formation, thin pinning stripes 46 have been deposited on the substrate 40. These pinning stripes are of a material having a higher chemical affinity for one of the domains of the assembled block copolymer, than for the other domain. Hence, the bock copolymer self assembly is directed by the enthalpic driving force (minimization of total free energy) directing that domain of the block copolymer which has a high chemical affinity for the pinning stripes 46 to be positioned over the pinning stripes 46 as self-assembly proceeds.

In FIG. 5B, an ordered, self-assembled layer of lamellar block copolymer composition is shown deposited and assembled on the surface of the substrate, in the trench, with self-assembly directed by the chemical epitaxy pattern of the pining stripes 46. It will be understood that although only two pinning stripes are shown, a plurality of such stripes, suitably spaced on substrate 40, may be employed. The bared substrate 40 between the side-walls of the trench is neutral in nature with respect to each of the alternating domains of the lamellar block copolymer composition 47, and so has a similar chemical affinity for each block or domain of the block copolymer 47. This permits the ordered lamellar block copolymer composition 47 to self-assemble with the alternating domains positioned side-by-side on the neutral surface the substrate 40, with the overall positioning and orientation of the ordered block copolymer pattern controlled by the pinning stripes 46 acting as a chemical epitaxy template.

One set or type of the alternating domains may, for instance, be subsequently removed during a selective etch process leaving the alternate domain in place, following solidification of the ordered lamellar pattern, in order to provide a template for deposition of rectangular metal contacts in the holes left by the removed domains, mutually spaced along the substrate axis A-A.

The pinning stripes 46 may be provided, for instance, by the deposition of an orientation layer on the substrate 40, the orientation layer having a high chemical affinity for the selected domain type, and a low chemical affinity for the other domain type, followed by etching of the orientation layer by a DUV or EUV lithography technique in order to leave the pinning stripes 46 with bared substrate 40 in between them. Suitably, the bared substrate 40 will be neutral to the respective domains of the block copolymer composition, meaning that it has a similar chemical affinity for each of the domains. This allows the lamellar block copolymer composition to deposit in the trench, with the alternating domains positioned side-by-side along the trench, without an excessive enthalpy penalty in the regions where the deposition is over the bared substrate 40.

FIGS. 6A and 6B schematically depict stages in the process according to an embodiment of the invention using a lamellar block copolymer composition and employing graphoepitaxy to direct self-assembly of the block copolymer composition.

Each Figure again represents a plan view of a substrate 40 having a positive tone resist layer 41 deposited on its surface. In FIG. 5A the resist layer 41 is shown after it has been exposed to UV radiation to expose a trench with straight, substantially parallel sidewalls lying along substrate axis A-A, with substrate 40, bared of resist 41, forming the base of the trench.

Following deposition of the resist layer and trench formation, a transverse wall 48 of a second resist composition has been deposited to lie across the trench. This transverse wall 48 is of a material having a higher chemical affinity for one of the domains of the assembled block copolymer, than for the other domain. Hence, the bock copolymer self assembly is directed by the enthalpic driving force (minimization of total free energy) directing the domain of the block copolymer that has a high chemical affinity for the material of the transverse wall 48, to be positioned adjacent to the face of the transverse wall 48 as self-assembly proceeds.

In FIG. 6B, an ordered, self-assembled layer of lamellar block copolymer composition is shown deposited and assembled on the surface of the substrate, in the trench, with self-assembly directed by the graphoepitaxy feature provided by the transverse wall 48. It will be understood that although only a single transverse wall 48 is shown, a plurality of such epitaxy features, suitably spaced on substrate 40, may be employed. The bared substrate 40 between the side-walls of the trench is neutral in nature with respect to each of the domains (continuous domain 45 and elongate discontinuous domains 44) of the block copolymer composition, and so has a similar chemical affinity for each block or domain of the block copolymer. This permits the ordered lamellar block copolymer composition to self-assemble with the alternating domains positioned side-by-side on the neutral surface the substrate, with the overall positioning and ordered block copolymer pattern controlled by the graphoepitaxy template of the transverse wall 48. The side-walls of the resist 41 are also suitably neutral in nature with respect to each of the alternating domains of the lamellar block copolymer composition 47, and so have a similar chemical affinity for each block or domain of the block copolymer 47. This permits the ordered lamellar block copolymer composition 47 to self-assemble with the alternating domains positioned side-by-side against the side-walls.

FIGS. 7A and 7B show schematic diagrams of an embodiment of a block copolymer composition, adapted to form discontinuous elliptical domains, for use in, e.g., a method described herein. FIG. 7A shows the two types of the di-block copolymer molecules present in this embodiment of block copolymer composition, with a first di-block copolymer molecule 49 having a first block of first monomer 51 and a second block of second monomer 50. For the first di-block copolymer molecule 49 the ratio of the molecular volume of the first block 51 to that of the second block 50, is approximately 3:7.

For the second di-block copolymer molecule 52, the first block of first monomer 54, also has a smaller molecular volume than the second block of second monomer 53. Again, for the second di-block copolymer molecule 52, the ratio of the volume of the first block 54 to the second block 53 is approximately 3:7. The second di-block copolymer 52 has a higher, overall molecular weight than that of the first di-block copolymer 49 such that the molecular weight of the first di-block copolymer is about 70% of the molecular weight of the second di-block copolymer. The molar ratio of first to second di-block copolymer is about 1:1 in this embodiment.

In FIG. 7B, the first and second di-block copolymers of the block copolymer composition are shown schematically arranged into an elliptical arrangement with the first blocks 51, 54 of the di-block copolymers located in the central or body region of the elliptical structure as the first discontinuous domain 44. The second blocks of the di-block copolymer molecules 50, 53 are arranged to form the continuous second domain 45. As a result of the differing molecular shapes for the two block copolymers, the first block copolymer preferentially locates in the central or body region of the elliptical arrangement with the second block copolymer molecules forming the ends of the elliptical arrangement where they are able to self-assemble as circular sections at the ends of the elliptical arrangement.

FIGS. 8A and 8B show schematic diagrams of a further embodiment of a block copolymer composition, adapted to form discontinuous elliptical domains, for use in, for example, a method described herein. FIG. 8A shows the two types of di-block copolymer molecules for use in this second embodiment of a block copolymer composition for use in the invention, with a first di-block copolymer molecule 55 having a first block of first monomer 57 and a second block of second monomer 56. For the first di-block copolymer molecule 55 the ratio of the molecular volume of the first block 57 to that of the second block, 56, is approximately 1:1.

The second di-block copolymer molecule 52, is as set out above for the first embodiment, with the first block of first monomer 54, having a smaller molecular volume than the second block of second monomer 53, with the ratio of the volume of the first block 54 to the second block, 53, is approximately 3:7.

However, for this embodiment of a block copolymer composition, the molecular weights of the first block 57 of the di-block copolymer 55 and the first block 54 of the second di-block copolymer 52 are approximately the same. The molar ratio of first to second di-block copolymer is about 1:1 in this embodiment.

In FIG. 8B, the first and second di-block copolymers of the block copolymer composition are shown schematically arranged into an elliptical arrangement with the first blocks 57, 54 of the di-block copolymers located in the central or body region of the elliptical structure as the first discontinuous domain 44. The second blocks of the di-block copolymer molecules 56, 53 are arranged to form the continuous second domain 45. As a result of the differing molecular shapes for the two di-block copolymers making up the block copolymer composition, the first di-block copolymer 55 preferentially locates in the central or body region of the elliptical arrangement with the second di-block copolymer 52 forming the ends of the elliptical arrangement where they are able to self-assemble as circular sections at the ends of the elliptical arrangement because of their shape, with the second block, of larger molecular volume than the first block, ideally adapted for packing into a circular geometry. For clarity, with respect to FIG. 8B, it is also possible that the phases may be mixed; and for e.g. entropic reasons it may be that the cylindrical phase is not at the curved part and the lamellar phase not in the straight part.

FIGS. 9A and 9B show schematic diagrams of a further embodiment of a block copolymer composition, adapted to form discontinuous elliptical domains, for use in, e.g., a method described herein. FIG. 9A shows the three types of block copolymer molecules used in this embodiment of a block copolymer composition. Two types of di-block copolymer molecules are present, and are the same molecules used in the embodiment as described with reference to FIGS. 8A and 8B.

There is also a third molecule in this block copolymer composition, this third molecule being a tri-block copolymer 59 having first 62 and third 60 blocks of first monomer at each end of the molecule with a central block 61 of second monomer forming the central core of the molecule. The second block of second monomer for the tri-block copolymer 59 has a molecular weight of about 300% of the molecular weight of the second block 56 of the first di-block copolymer molecule 55, whereas the molecular weights of the first 62 and third 60 blocks of the tri-block copolymer 59 are each individually about the same as the molecular weight of the first block 57 of the first di-block copolymer 55.

In FIG. 9B, the first 55 and second 52 di-block copolymers of this embodiment of block copolymer composition are shown schematically arranged into an elliptical arrangement with the first blocks 57, 54 of the di-block copolymers located in the central or body regions of the elliptical structure as the first discontinuous domain 44. The second blocks 56, 53 of the di-block copolymer molecules 56, 53 are arranged to form the continuous second domain 45. As a result of the differing molecular shapes for the two di-block copolymers making up the block copolymer composition, the first di-block copolymer 55 preferentially locates in the central or body region of the elliptical arrangement with the second di-block copolymers 52 forming the ends of the elliptical arrangement where it is able to self-assemble as circular sections at the ends of the elliptical arrangement because of its shape, with the second block, of larger molecular volume than the first block, ideally adapted for packing into a circular geometry.

Also, for this embodiment of block copolymer composition, the tri-block copolymer 59 fits into the structure by forming bridges between adjacent pairs of discontinuous domains 44. The tri-block copolymer 59 is adapted so that the first 62 and third 60 blocks of first monomer will be located within the first discontinuous domain 44, while the central second block 61 is located in the continuous domain 45 in a region of that domain lying between adjacent pairs of discontinuous domains 44. This is as shown in FIG. 9B.

If required, for any of the embodiments described, flood exposure to ultraviolet radiation may be applied, after formation of the trench, in order to expose the remaining resist 41 to UV to render the side-walls of the trench hydrophilic, hydrophobic or neutral in nature, depending upon the details of the resist and of the self-assemblable block copolymer composition to be used. Alternatively, or additionally, the chemical affinity of the side walls may be modified by deposition of a orientation layer thereon, for instance by a chemical vapor deposition process step.

The block copolymer compositions adapted to form elliptical discontinuous domains, as mentioned hereinbefore, are thought to be effective as the differing block copolymers of the compositions described are adapted to occupy different positions within the self-assembled domains. Hence, the shape (molecular volume) of the blocks of the various block copolymers is suited to adapt them to the geometric constraints imposed by the requirements of the shapes of the elliptical domains. Hence, for the bodies of the elliptical domains, lamellar packing geometry is suitable, whereas for the ends, circular packing geometry is more appropriate.

Self-assemblable block copolymer compositions, as mentioned herein, comprising from about 5 to about 20% by weight of an oligomer of the first monomer, wherein the molecular weight of the oligomer is from about 5% to about 80% of the molecular weight of the first block of the first di-block copolymer may be useful for reducing or preventing entropic driving forces causing preferential assembly of shorter blocks of the di-block copolymers of the block copolymer composition at side-walls of the trench.

The use of a first type of tri-block copolymer, wherein the first tri-block copolymer comprises a moiety as for the second di-block copolymer, but with a third block of first monomer at an opposite end of the second block to the first block of the moiety, the molecular weight of the third block being from 10% to 80% of the molecular weight of the first block of the moiety, may also be useful for orientation, as the entropic driving force will tend to cause the third block of first monomer to orient at the trench side-walls with the first blocks in the bodies of the discontinuous domains of the ellipsoid.

The use of a second type of tri-block copolymer, having first and third terminal blocks of the same monomer, and substantially the same molecular weight, as the first block of the first di-block copolymer, and a second central block of the same monomer as the second block of the first di-block copolymer, but a molecular weight of about 200% of that of the second block of the first di-block copolymer, may be useful to link together the discontinuous elongate domains by acting as ties therebetween.

For an embodiment of the method, the epitaxial features may comprise one or more recesses in one or more of the side-walls of the trench. As described hereinbefore, these recesses may be formed by exposing a pattern of overlapping ellipses having major axes lying mutually substantially parallel and substantially normal to the substrate axis, and removing the exposed resist layer to leave a trench having a base of substrate bared of resist and the recessed opposed side-walls. An embodiment of the invention provides the benefit that the first elongate discontinuous domains, in the form of ellipses, may be considerably smaller in size than the size of the smallest ellipses, which the photolithographic method used for forming the trench, is capable of exposing.

An embodiment of the invention allows for formation, onto a substrate, of mutually spaced elongate lithography features, positioned side-by side along a substrate axis, using a self-assembled block copolymer composition to provide features which are closely spaced and small in size.

An embodiment of the present invention relates to a lithography method. The method may be used in a process for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc. An embodiment of the invention is also of use to create regular nanostructures on a surface for use in the fabrication of integrated circuits, bit-patterned media and/or discrete track media for magnetic storage devices (e.g. for hard drives).

In particular, an embodiment of the invention is of use for high resolution lithography, where features patterned onto a substrate have a feature width or critical dimension of about 100 nm or less or even about 50 nm or less such as about 20 nm or less. An embodiment of the invention is particularly useful for forming contact electrodes for a NAND device. A NAND device prepared according to a method, or using a composition, described herein is capable of reduced contact resistance and better performance characteristics than prior devices.

Lithography may involve applying several patterns onto a substrate, the patterns being stacked on top of one another such that together they form a device such as an integrated circuit. Alignment of each pattern with a previously provided pattern is an important consideration. If patterns are not aligned with each other sufficiently accurately, then this may result in some electrical connections between layers not being made. This, in turn, may cause a device to be non-functional. A lithographic apparatus therefore usually includes an alignment apparatus, which may be used to align each pattern with a previously provided pattern, and/or with alignment marks provided on the substrate.

In this specification, the term "substrate" is meant to include any surface layers forming part of the substrate, or being provided on a substrate, such as other planarization layers or anti-reflection coating layers which may be at, or form, the surface of the substrate, or may include one or more other layers such as those specifically mentioned above with reference to particular embodiments of the invention.

The invention claimed is:

1. A method of forming a row of mutually spaced elongate lithography features along a substrate axis on a substrate, the method comprising:
   providing a ordered layer of self-assemblable block copolymer composition on the substrate by:
      causing a self-assemblable block copolymer composition in a trench to self-assemble to give an ordered layer of self-assembled block copolymer composition in the trench, the trench being through a resist layer on the substrate, over the substrate axis, aligned with its length lying substantially parallel to the substrate axis and having a side-wall of resist and a base of substrate bared of resist,
      wherein the block copolymer composition is adapted to form an ordered layer comprising first elongate domains, defining long axes substantially parallel to their greatest widths, self-assembled side-by-side on the substrate, alternating with a second domain therebetween, wherein the long axes of the elongate domains lie substantially parallel to each other, and substantially parallel to the substrate,
      wherein an epitaxial feature is provided in the trench to direct self-assembly of the block copolymer composition such that the long axes of the elongate domains lie substantially normal to the substrate axis, and
   using the ordered layer of self-assembled block copolymer composition as a further resist layer to provide the mutually spaced elongate lithography features on the substrate.

2. The method of claim 1, wherein the first elongate domains are discontinuous elliptical domains and the second domain is a continuous domain.

3. The method of claim 2, wherein the self-assemblable block copolymer composition comprises:
   a first di-block copolymer having a first block of first monomer and a second block of second monomer, and
   a second di-block copolymer having a first block of the first monomer and a second block of the second monomer,
   wherein the first di-block copolymer is configured to self-assemble with lamellar packing geometry with the first block assembled in bodies of the elliptical domains and the second block assembled in the second domain, and
   wherein the second di-block copolymer is configured to self-assemble with circular packing geometry with the first block assembled in ends of the elliptical domains and the second block assembled in the second domain.

4. The method of claim 3, wherein the ratio of molar volume of first to second blocks is from about 1:4 to about 2:3 for each of the first and second di-block copolymers, and wherein the molecular weight of the first di-block copolymer is less than the molecular weight of the second di-block copolymer.

5. The method of claim 3, wherein the ratio of molar volume of first to second blocks is from about 3:2 to about 2:3 for the first di-block copolymer and wherein the ratio of molar volume of first to second blocks is from about 2:3 to about 1:4 for the second di-block copolymer, and wherein the first block of the first di-block copolymer has a molecular weight from about 80 to about 120% of the molecular weight of the first block of the second di-block copolymer.

6. The method of claim 3, wherein the self-assemblable block copolymer composition further comprises from about 5% to about 20% by weight of an oligomer of the first monomer, wherein the molecular weight of the oligomer is from about 5% to about 80% of the molecular weight of the first block of the first di-block copolymer.

7. The method of claim 3, wherein the self-assemblable block copolymer composition further comprises a first tri-block copolymer wherein the first tri-block copolymer comprises a moiety as for the second di-block copolymer, but with a third block of first monomer at an opposite end of the second block to the first block, the molecular weight of the third block being from about 10% to about 80% of the molecular weight of the first block.

8. The method of claim 3, wherein the self-assemblable block copolymer composition further comprises a second tri-block copolymer having first and third terminal blocks, of the same monomer and substantially the same molecular weight as the first block of the first di-block copolymer, and a second central block of the same monomer as the second block of the first di-block copolymer, but a molecular weight of about 180% to 400% of that of the second block of the first di-block copolymer.

9. The method of claim 4, wherein the ratio of molar volume of first to second blocks is about 3:7 for each of the first and second di-block copolymers.

10. The method of claim 1, wherein the epitaxial feature comprises a recess in the side-wall of the trench.

11. The method of claim 10, wherein the resist layer is of a positive tone resist, and further comprising forming the trench by:
   selectively exposing the resist layer to actinic radiation to expose a pattern of overlapping ellipses having major axes lying mutually substantially parallel and substantially normal to the substrate axis, and
   removing the exposed resist layer to leave a trench having a base of substrate bared of resist and the recessed side-wall.

12. The method of claim 1, wherein the block copolymer composition is adapted to form an ordered layer which is a lamellar ordered layer wherein the first elongate domains are lamellae alternating with second domains which are also lamellae, the lamellae of the first and second domains oriented with their planar surfaces lying substantially normal to the substrate and substantially normal to the substrate axis.

13. The method of claim 12, wherein the epitaxy feature comprises a graphoepitaxy template comprising a transverse wall of the trench having a face with a higher chemical affinity for one of the first and second domains than for the other of the first and second domains, the transverse wall lying across the trench with the face substantially normal to the substrate and substantially normal to the substrate axis.

14. The method of claim 12, wherein the epitaxy feature comprises a chemical epitaxy template comprising a pinning stripe on the base of the trench, the stripe lying across the trench, on the substrate, substantially normal to the substrate axis, and the pinning stripe having a higher chemical affinity for one of the first and second domains than for the other of the first and second domains.

15. The method of claim 1, wherein the mutually spaced elongate lithography features are of highly conductive material in recesses on the substrate, formed by:
   removing the first domains by breakthrough etching to provide a pattern of the second domain on the surface of the substrate, in the trench, with the substrate laid bare between the pattern features of the second domain,
   transferring the pattern by transfer etching, using an etchant which is resisted by the second domain, to form recesses in the substrate surface, and
   providing the highly conductive material in the recesses.

16. The method of claim 1, wherein the lithography features are contact electrodes for a NAND device.

17. The method of claim 1, further comprising forming the trench through the resist layer.

18. The method of claim 1, further comprising providing the self-assemble block copolymer composition in the trench.

19. A self-assemblable block copolymer composition adapted to form an ordered layer on a substrate, the ordered layer comprising discontinuous first elongate elliptical domains, defining long axes substantially parallel to their greatest widths, self-assembled side-by-side alternating with a second domain therebetween, wherein the long axes of the elongate domains lie substantially parallel to each other, and substantially parallel to the substrate, wherein the self-assemblable block copolymer composition comprises:

a first di-block copolymer having a first block of first monomer and a second block of second monomer, and a second di-block copolymer having a first block of the first monomer and a second block of the second monomer, wherein the first di-block copolymer is configured to self-assemble with lamellar packing geometry with the first block assembled in bodies of the discontinuous first elongate elliptical domains and the second block assembled in the second domain, and wherein the second di-block copolymer is configured to self-assemble with circular packing geometry with the first block assembled in ends of the discontinuous first elongate elliptical domains and the second block assembled in the second domain.

20. The composition of claim 19, wherein the ratio of molar volume of first to second blocks is from about 1:4 to about 2:3 for each of the first and second di-block copolymers, and wherein the molecular weight of the first di-block copolymer is less than the molecular weight of the second di-block copolymer.

* * * * *